United States Patent [19]
Sullivan

[11] Patent Number: 5,365,238
[45] Date of Patent: Nov. 15, 1994

[54] PRECISION TIME MEASUREMENTS

[75] Inventor: William B. Sullivan, Verona, N.J.

[73] Assignee: Wide Band Systems, Inc., Franklin, N.J.

[21] Appl. No.: 158,947

[22] Filed: Nov. 29, 1993

[51] Int. Cl.$^5$ ............................................. G01S 7/28
[52] U.S. Cl. .................... 342/195; 342/147; 342/56; 342/13
[58] Field of Search ............... 342/195, 147, 175, 194, 342/56

[56] References Cited

U.S. PATENT DOCUMENTS

| | | | |
|---|---|---|---|
| 3,886,553 | 5/1975 | Bates | 342/465 |
| 4,209,835 | 6/1980 | Guadagnolo | 342/13 X |
| 4,721,958 | 1/1988 | Jenkin | 342/13 |
| 5,091,917 | 2/1992 | Udd et al. | 342/44 X |

Primary Examiner—John B. Sotomayor
Attorney, Agent, or Firm—Z. T. Wobensmith, III

[57] ABSTRACT

A circuit arrangement that utilizes digital data representative of the amplitude of an RF pulse envelope is disclosed. The circuit arrangement comprises a PROM having prestored and addressable routines and a nine stage sequentially arranged eight (8) bit latches that are clocked at a rate of 25 nanoseconds. The circuit arrangement determines, within 25 nanoseconds, when the maximum value of the RF pulse envelope is within a selectable 6 dB or 3 dB point and generates a control signal SV that causes the data in the upper stages of the nine stage latches to be frozen and further generates an address that is routed to the PROM, wherein a family of waveform shapes are accessed. The circuit arrangement provides for four (4) data points that are examined by prestored routines of the PROM and compared against the prestored family of waveform shapes, and, upon a match therebetween, determines the time of arrival (TOA) and pulse width of the RF pulse envelope being received by the circuit arrangement.

25 Claims, 4 Drawing Sheets

PRECISION TIME MEASUREMENTS

FIELD OF THE INVENTION

The present invention relates to a circuit arrangement for measuring the amplitude of an RF pulse envelope to determine its time of arrival (TOA) and the pulse width of the signals therein. More particularly, the circuit arrangement measures the amplitude of the digital words comprising the RF envelope and determines the maximum amplitude of the RF envelope within a predetermined time and within a predetermined point, such as 3 dB or 6 dB and, then, uses the obtained data therefrom, along with precedent and subsequent data, to determine the exact time of arrival (TOA) and pulse width of the RF envelope within an accuracy of less than 1 nanosecond (e.g., less than 0.5 nanoseconds).

BACKGROUND OF THE INVENTION

The precise measurement of the time of arrival (TOA) of an RF pulse envelope is of substantial importance to radar equipment. An accurate TOA makes it possible for a radar, such as a radio directional finder or emitter (transmitter) locater, to determine the direction from which a signal is received, thus, revealing the direction of the receiver with respect to the transmitting station and vice-versa, as well as determining the location of the transmitting station. Since the precise TOA measurements are in terms of absolute time, it is possible to relate the time measurements from two different receivers, separated by a substantial distance, and accomplish bistatic transmitter station location. Normally, as part of a TOA measurement, a precise pulse width measurement is also accomplished which allows for the identification of a particular transmitter, within a group of similar transmitters, by detecting minor differences in the particular circuits which transmit the RF signal having an identifiable pulse width.

Earlier techniques for precision time measurement have included a so called "snapshot digitizer," which digitizes the RF pulse envelope at a very high rate, of the order of 100 MHz. In such a circuit, following the detection of the presence of the RF pulse envelope, digitizing continues for a predetermined duration and, then, the digital samples are transferred to a computer wherein the samples are analyzed to determine the TOA and pulse width of the RF pulse envelope. This is usually a relatively slow and expensive process and, further, even with the 100 MHz sampling rate, the snapshot digitizer requires interpolation between the samples separated by 10 nanoseconds to achieve a resolution in the order of 1 nanosecond. It is desired that a less expensive yet more accurate time measurement device be provided.

A second known technique for measuring TOA and pulse width is to employ a very fast clock, e.g., 1,000 MHz, and a detection circuit, such as a threshold detector, to detect the time when the arriving RF pulse envelope reaches a predetermined threshold value. The accuracy of this technique is dependent upon, among other things, both the rise time and signal strength of the received RF pulse envelope. For example, if the received RF envelope has a 100 nanosecond rise time, from the predetermined threshold point crossing to the half-power point of the RF pulse envelope, then this technique would exhibit a 100 nanosecond variation in its measurement when the signal strength is reduced until the half-power point of the RF pulse envelope is exactly at the predetermined threshold value.

A phase interferometer, having closely spaced and matched receivers, is sometimes used to provide a precision type measurement of received RF signals. The received RF signals; i.e., an RF pulse envelope comprising an RF carrier, are split into two separate paths and the phase difference is measured therebetween. This device is somewhat limited in that the accuracy of its time measurement is dependent upon the closely-spaced and matched signal receivers.

It is desired that a circuit arrangement and a method of use thereof be provided that would overcome the drawbacks of the prior art which appear to be limited to devices requiring matched receivers, or relatively expensive but slow measurement techniques, all of which have an accuracy that is limited to about 1 nanosecond.

It is, therefore, a primary object of the present invention to provide a circuit arrangement for measuring the RF pulse amplitude to accurately determine the time of arrival (TOA) and pulse width thereof, within an accuracy of less than 1 nanosecond.

It is another object of the present invention to provide a method for measuring the RF pulse amplitude to determine, within an accuracy of less than 1 nanosecond, its time of arrival (TOA) and pulse width.

It is a further object of the present invention to provide accurate time of arrival (TOA) and pulse width measurements of an RF pulse envelope at predetermined and selectable pulse width points, such as its 3 dB points.

Other objects of the present invention, as well as advantages thereof over existing and prior art forms, which will be apparent in view of the following detailed description, are accomplished by means hereinafter described and claimed.

SUMMARY OF THE INVENTION

The present invention is directed to a circuit arrangement for receiving, holding and measuring an RF pulse envelope having an amplitude with predetermined rise and fall times and comprising digital words having a predetermined number of bits with a predetermined bit resolution. The circuit arrangement provides accurate measurements of the time of arrival (TOA) and the pulse width associated with the RF pulse envelope.

A circuit arrangement comprises a first plurality of sequential latches, a summing reference network, a first plurality of subtracting networks, a logic element, a second plurality of sequential latches, a second plurality of subtracting networks, and a PROM having prestored and addressable routines. Each of the first plurality of sequential latches is responsive to a time signal having a predetermined frequency and each receives and stores one of the digital words comprising the RF pulse envelope. The first plurality of latches, each having an output, are arranged into lower and upper stages with one of the lower stages serving as a reference stage. The summing reference network has an output and first and second inputs, with the first input connected to the output of the reference stage and the second input connected to a reference quantity which comprises a digital word and which defines a predetermined point of the RF pulse envelope. The first plurality of subtracting networks each have an output and first and second inputs. The first plurality of subtracting networks are arranged so that each one has its first input connected to the output of the lower and upper stages, except for the reference stage, of the first plurality of latches. Each of the first. plurality of subtracting networks has its second input connected to the output of the summing reference network. The logic element has inputs connected to each of the outputs of the first plurality of subtracting networks and generates an output control signal SV in the absence of signals on its inputs. The occurrence of the control signal SV is indicative that the cumulative contents of both the reference stage and the contents of the reference quantity is within the predetermined point of the maximum amplitude of the RF pulse envelope. The second plurality of sequential latches each have input and output stages, an output and first and second inputs, as well as each being responsive to the output control signal SV. The second plurality of latches are arranged in parallel with and receive and store the digital words being received and stored by the upper stages of the first plurality of latches. The second plurality of subtracting networks each have an output, and first and second inputs and a first network which has its first input connected to the output of a first latch of the second plurality of latches and its second input connected to the output of the second latch of the second plurality of latches. A second network of the second plurality of the substracting network has its first input connected to the second input of the first network and its second input connected to the output of a third latch of the second plurality of latches. A third network of the second plurality of subtracting networks has its first input connected to the second input of the second network and its second input connected to a fourth latch of the second plurality of latches. The PROM, having the prestored and addressable routines, receives the output of the second plurality of subtracting networks, the outputs of the first sequential latches, and the output control signal SV. The output of the reference stage contains first data which is in coincidence with the control signal SV and which defines the amplitude of the RF pulse envelope at the predetermined point established by the reference quantity. The output lower stages of the first plurality of latches contains second data that defines relative to the predetermined point the precedent and subsequent amplitudes of the RF pulse envelope. The outputs of the second plurality of subtracting networks defines an address to the PROM so as to access a family of waveform shapes having a peak value corresponding to the predetermined point. The PROM, as part of its prestored routines, sequentially compares the precedent and subsequent amplitudes against each of the family of waveform shapes to define a match therebetween that provides a time location, relative to the occurrence of the control signal SV, that corresponds to the 3 dB point on the RF pulse envelope. The time location being definable within selectable increments of the predetermined frequency of the timing signal.

The present invention also provides a method of using the circuit arrangement to accurately measure the time of arrival and pulse width of the RF pulse envelope.

DESCRIPTION OF THE DRAWINGS

FIG. 4 comprises FIGS. 4(A) and (B) which respectively illustrate the standard deviation and means error distributions resulting from a Monte Carlo statistical sampling related to the operation of the circuit arrangement of FIGS. 1 and 2.

DETAILED DESCRIPTION OF THE PREFERRED EMBODIMENTS

Figure 1:
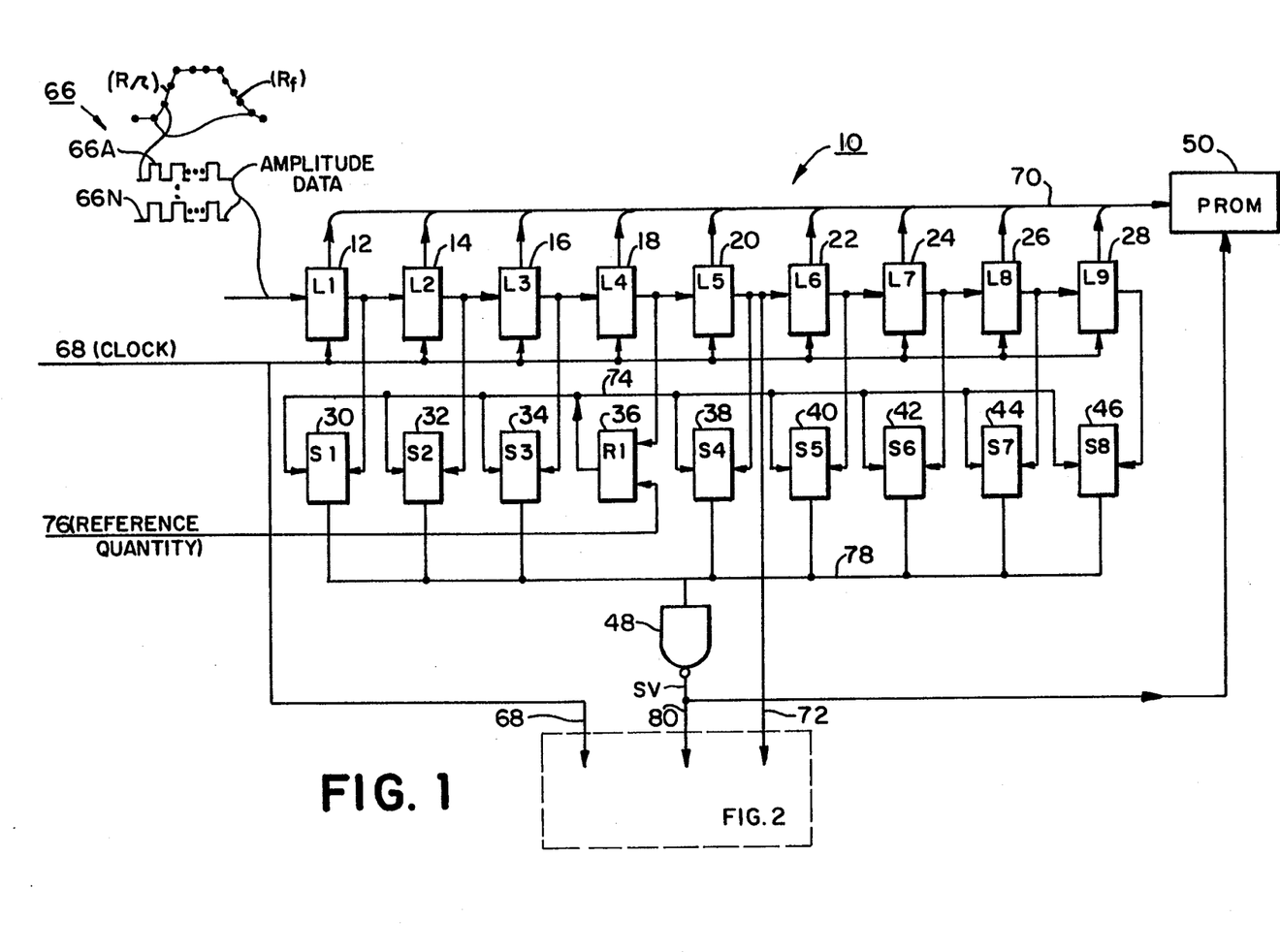
FIGS. 1 and 2 illustrate the circuit arrangement of the present invention for accurately determining the time of arrival (TOA) and pulse width of a received RF pulse envelope.
Figure 2:
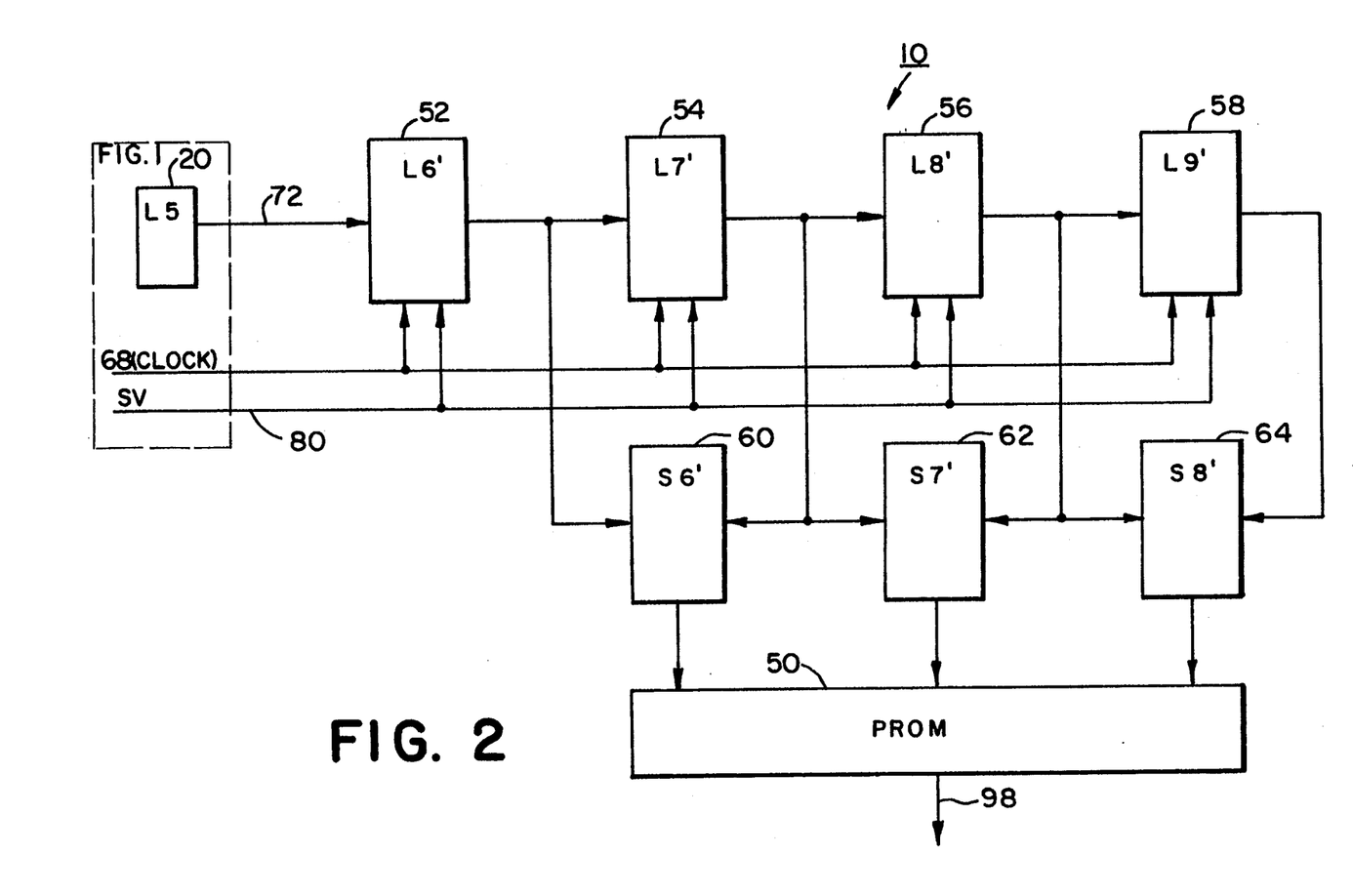

Referring to the drawings, wherein like reference numbers indicate like elements, there is shown in FIGS. 1 and 2 a circuit arrangement 10 of the present invention.

In general, the circuit arrangement 10 utilizes digital data representative of the amplitude of the RF pulse envelope and directs predetermined segments of this digital data to a PROM having prestored and addressable routines. The circuit arrangement 10 determines the maximum value of the RF pulse envelope to be within a predetermined point and generates a control signal SV in coincidence therewith. The predetermined point e.g., the well-known −6 dB or −3 dB point of a waveform, is selected so that the shape of the RF pulse envelope may be determined. The PROM analyzes four amplitude points of the RF pulse envelope, all interrelated to the occurrence of the control signal SV, and interconnects the four measured amplitude points by means of a predetermined curve fitting routine. The control signal SV also activates logic to generate an address word to the PROM which, in turn, accesses a family of possible waveform shapes all related to the curve-fitted four amplitude points. The PROM, as part of its prestored routines, sequentially compares curved-fitted four amplitude points against each of the family of waveform shapes to define a match therebetween, and which provides the time location, relative to the occurrence of the control signal SV, of the 3 db point of the RF pulse envelope, as well as defining such a time location with an accuracy which is less than 1 nanosecond (e.g., less than 0.5 nanoseconds).

The circuit arrangement of FIGS. 1 and 2 comprises a plurality of elements each having a reference number, some also having a related symbol, each being of a conventional type or supplied by a typical supplier, and all of which being given in the below Table 1.

TABLE 1

| Reference No. | Symbol | Function | Conventional/Typical Supplier |
| --- | --- | --- | --- |
| 12 | L1 | 8 bit latch | Conventional |
| 14 | L2 | 8 bit latch | Conventional |
| 16 | L3 | 8 bit latch | Conventional |
| 18 | L4 | 8 bit latch | Conventional |
| 20 | L5 | 8 bit latch | Conventional |
| 22 | L6 | 8 bit latch | Conventional |
| 24 | L7 | 8 bit latch | Conventional |
| 26 | L8 | 8 bit latch | Conventional |
| 28 | L9 | 8 bit latch | Conventional |
| 30 | S1 | Subtracting Network | Conventional |
| 32 | S2 | Subtracting Network | Conventional |
| 34 | S3 | Subtracting Network | Conventional |
| 36 | R1 | Summing Reference Network | Conventional |
| 38 | S4 | Subtracting Network | Conventional |
| 40 | S5 | Subtracting | Conventional |

TABLE 1-continued

| Reference No. | Symbol | Function | Conventional/Typical Supplier |
|---|---|---|---|
| 42 | S6 | Subtracting Network | Conventional |
| 44 | S7 | Subtracting Network | Conventional |
| 46 | S8 | Subtracting Network | Conventional |
| 48 | — | NOR Circuit | Conventional |
| 50 | — | PROM | Cypress CY7C263 |
| 52 | L6' | 8 bit latch | Conventional |
| 54 | L7' | 8 bit latch | Conventional |
| 56 | L8' | 8 bit latch | Conventional |
| 58 | L9' | 8 bit latch | Conventional |
| 60 | S6' | Subtracting Network | Conventional |
| 62 | S7' | Subtracting Network | Conventional |
| 64 | S8' | Subtracting Network | Conventional |

The circuit arrangement 10 of FIGS. 1 and 2 measures the parameters of an RF pulse envelope 66 (see FIG. 1) having an amplitude with a rise ($R_r$) and a ($R_f$) fall time and comprising digital words 66A ... 66N, each having a predetermined number of bits and a predetermined bit resolution. The rise time $R_r$ preferably exceeds 6 dB within a 75 nanosecond time duration and the fall time $R_f$ exceeds 6 dB within the time duration of 125 nanoseconds. The digital words 66A ... 66N each preferably comprise eight (8) binary bits, with each bit having a resolution of 0.5 dB. For such a selection, words 66A ... 66N, having an amplitude value corresponding to a power level given in dB, that differ from one another by six (6) dB are representative of a twelve (12) bit difference. The eight (8) bits of each word represent a particular amplitude point of the RF pulse envelope 66. The RF pulse envelope 66 is applied to the first plurality of sequentially arranged latches 12, 14, 16, 18, 20, 22, 24, 26 and 28, each of which is responsive to a timing signal, such as clock pulse 68.

FIG. 1 shows each of the latches 12 ... 28 receiving a clock signal 68, so as to be sampled at a particular clocking rate; however, the latches 12 ... 28 perform equally well in response to a triggered pulse generated by a one-shot multivibrator (not shown). The trigger or clock pulse 68 has a predetermined frequency, preferably, 25 nanoseconds which corresponds to a clocking rate of 40 MHz.

The latches 12 ... 28 acquire nine (9) words, every 25 nanoseconds, each comprising eight (8) bits and each representative of a particular amplitude of the RF pulse envelope 66. The latches 12 ... 28 are sequentially arranged, as shown, and comprise a lower stage including latches 12, 14, 16, 18 and 20 and an upper stage including latches 22, 24, 26 and 28. Latch 18 of the lower stage also serves as the latch for a reference stage which is of particular importance to the present invention. The digital contents of each of the latches 12 ... 28 are directed to the PROM 50 by way of data bus 70, and the occurrence of the control signal SV, to be described, is also directed to PROM 50. Further, the output of the individual latches 12, 14, 16, 20, 22, 24, 26 and 28 are individually and respectively routed to a first plurality of subtracting networks comprising 30, 32, 34, 38, 40, 42, 44 and 46. Furthermore, the output of the reference latch 18 is routed to a first input of the summing reference network 36. Further, the output of latch 20 is routed to the logic arrangement of FIG. 2, to be described, by way of signal path 72.

The summing reference network 36 has an output that is applied, by way of signal path 74, to a first input of each of the subtracting networks 30, 32, 34, 38, 40, 42, 44 and 46. The summing reference network 36 has first and second inputs, with the second input connected to a reference quantity 76.

The reference quantity 76, also referred to herein as ratio, comprises a digital word of eight (8) bits that may be set, preferably in 0.5 dB steps, to a plurality of values. The reference quantity 76 may be set to a 3 dB or 6 dB value each of which corresponds to a particular point of the amplitude of the RF pulse envelope 66. For example, the 3 dB value corresponds to points on each side of the maximum amplitude or magnitude of the RF pulse envelope 66 at which the power is 3 dB below the peak value. As will be further discussed with reference to FIG. 3, the reference quantity 76 is preferably set to a quantity that corresponds to the 6 dB points relative to the maximum amplitude of the RF pulse envelope 66.

Each of the subtracting networks 30, 32, 34, 38, 40, 42, 44 and 46 have an output, and first and second inputs. The subtracting networks 30, 32, 34, 38, 40, 42, 44 and 46 are arranged so that their first input is respectively connected to the eight (8) bit latches 12, 14, 16, 20, 22, 24, 26 and 28, and each of their outputs is routed, by way of signal path 78, to the input of NOR circuit 48. Each of the subtracting networks 30, 32, 34, 38, 40, 42, 44 and 46 preferably provides a one (1) bit quantity on its output when the contents of its first input exceeds the contents of its second input. The summing reference network 36 receives the contents of the latch 18, serving as the reference stage, and adds such contents to the predetermined reference quantity 76, preferably selected to correspond to a 12 bit value equal to 6 dB. The summation of these quantities (reference stage 18 and reference quantity 76) is outputted on the signal bus 74 to all of the first plurality of subtracting networks 30, 32, 34, 38, 40, 42, 44 and 46, wherein each of the subtracting networks compares, in magnitude, its digital quantity received from its respective eight (8) bit latch against the digital quantity received from the summing reference network 36. If any of the latches (12, 14, 16, 20, 22, 24, 26 and 28) contain a digital quantity that exceeds the magnitude of the contents (contents of reference stage 18 in addition to the reference quantity 76) of the summing reference network 36, the output control signal SV of the NOR gate 48 is in its inactive state. However, if every one of the latches 12, 14, 16, 20, 22, 24, 26 and 28 have contents which are less, in magnitude, than the contents of the summing reference network 36, then the output of all the subtracting networks 30, 32, 34, 38, 40 42, 44 and 46 are all "0's" and, therefore, the NOR circuit 48 generates the control signal SV. As will be further described, the occurrence of the control signal SV is indicative that the amplitude of the RF pulse envelope 66, represented by the contents of the latch 18 and the reference quantity 76, is within the 6 dB point of the maximum value or magnitude of the RF pulse envelope 66. Furthermore, the occurrence of the control signal SV is indicative that the 6 dB condition of the RF pulse envelope 66 came into existence within a time frame of 25 nanoseconds thereof. The control signal SV is routed, by way of signal path 80, to PROM 50 and to further logic of the circuit arrangement 10, which may be further described with reference to FIG. 2.

FIG. 2 illustrates a second plurality of sequentially arranged latches 52 (L6'), 54 (L7'), 56 (L8') and 58 (L9') having input and output stages and all being responsive to the control signal SV on signal path 80 as well as being responsive to the clock signal 68. Latch 52 receives the output of latch 20 (fifth stage of FIG. 1) on signal path 72 so that latches 52, 54, 56 and 58 respectively contain the same digital information as that of latches 22, 24, 26 and 28. More particularly, because the latch 52 receives the same information as latch 22 and because all of the subsequent latches 54, 56 and 58 of FIG. 2 and latches 24, 26 and 28 receive the same clock signal 68, then latches 52, 54, 56 and 58 are operatively arranged in parallel with latches 22, 24, 26 and 28 and respond in unison and respectively contain the same information.

FIG. 2 further illustrates a second plurality of subtracting networks 60 (S6'), 62 (S7') and 64 (S8') each having an output, and first and second inputs. The first network 60 has its first input connected to the output of the first latch 52 of the second plurality of latches and its second input connected to the output of the second latch 54. The second network 62 has its first input connected to the second input of the first network 60 and its second input connected to the output of the third latch 56. The third network 64 has its first input connected to the second input of the second network 62 and its second input connected to the output of the fourth latch 58. The networks 60, 62 and 64 each receive an eight (8) bit quantity from their respective adjacent latches (52–54, 54–56, and 56–58) and supply a four (4) bit output quantity representative of the difference between the quantities applied to or present on their first and second inputs. The second plurality of subtracting networks 60, 62, 64 are arranged to have each of the third (64), second (62) and first (60) networks supplying a four (4) bit quantity that are arranged into a twelve (12) bit address for addressing addressable prestored routines in the PROM 50. The arrangement of such a twelve (12) bit address may be more clearly described with reference to an example of the possible contents being simultaneously held in the latches 52, 54, 56 and 58.

For such an example, it is assumed that latch 58 (also latch 28 of FIG. 1) contains data (word 66A ... or 66N—see FIG. 1—) having a decimal value 20 which corresponds to an amplitude of the RF pulse envelope 66 having a value of −70 dBm. This data is based on a reference or lowest recognizable power value of the RF pulse envelope 66 being equal to −80 dBm. More particularly, the 20 bits, each having a bit weight corresponding to 0.5 dB, represents a 10 dBm (20×0.5 dB) increase from the −80 dBm reference power value so as to provide a −70 dBm quantity. Similarly, assume that latch 56 (also latch 26 of FIG. 1) contains 40 (decimal) bits representative of an amplitude data (66A ... or 66N) of the RF pulse envelope 66 being of a power value of −60 dBm. Further, latch 54 (also latch 24 of FIG. 1) contains 42 (decimal) bits of amplitude data information of the RF pulse envelope 66 representative of power value of −59 dBm. Still further, latch 52 (also latch 22 of FIG. 1) contain 43 (decimal) bits which corresponds to an amplitude of −58.5 dBm of the RF pulse envelope 66. Further, it should be understood that the differences in the amplitude data to be analyzed by PROM 30 for this example and for actual operation normally does not differ from each other by more than 12 bits. This 12 bit criterion is based upon the anticipated rise ($R_r$) and fall ($R_f$) times, previously discussed, of the typical RF pulse envelope 66 being measured by the circuit arrangement 10 of FIGS. 1 and 2. Exceptions to the 12 bit limitation is the differences in the amplitude values between amplitude's samples that precede the activation and occurrence of the control signal SV, and which differences are used to address the PROM 50. In practice, the different address values provided to the PROM 50 is greater than 12 bits when the difference between the quantities being measured are larger than 6.5 dB (13 bits). A fourteen (14) bit difference of the address value is reserved for differences in the quantities of adjacent networks (60, 62, and 64) that are larger than 6.5 dB, and a 15 bit quantity is reserved when the differences between adjacent networks (60, 62 and 64) are negative. These difference values of 13, 14 and 15 bits are preferably provided by the networks 60, 62 and 64.

The quantities given in latches 52, 54, 56 and 58 for the particular example are routed to their respective subtracting networks 60, 62, and 64. Each of the subtracting networks 60, 62, and 64 provides a four (4) bit output quantity that is equal to the difference between of the eight (8) bit quantities received on its first and second inputs. Each of the subtracting networks 60, 62, and 64 provides a segment (4 bits) of the address (12 bits) that is routed to the PROM 50. More particularly, each of the networks 60, 62 and 64 provides a four (4) bit output which is representative of the difference between its inputs. The network 64 provides the lowermost four bits of the address to PROM 50, network 62 provides the next lowermost four bits of the address to PROM 50 and, finally, network 60 provides the next four bits (uppermost four bits) of the address to PROM 50.

For the values given above, the difference between latches 56 and 58 is greater than 6.5 dB so that the subtracting network 64 generates an output quantity "1110." The difference between latches 54 and 56 is a two (2) bit quantity representative of 1 dBm difference, and, therefore, the subtracting network 62 generates an output quantity of "0010." The difference between latches 52 and 54 represents a digital quantity of 1, so that the subtracting network 60 produces an output quantity of "0001." The composite address word generated by the subtracting network 60, 62 and 64, for the example given, is "0001 0010 1110." The operation of the PROM 50 may be further described with reference to FIG. 3.

Figure 3A:
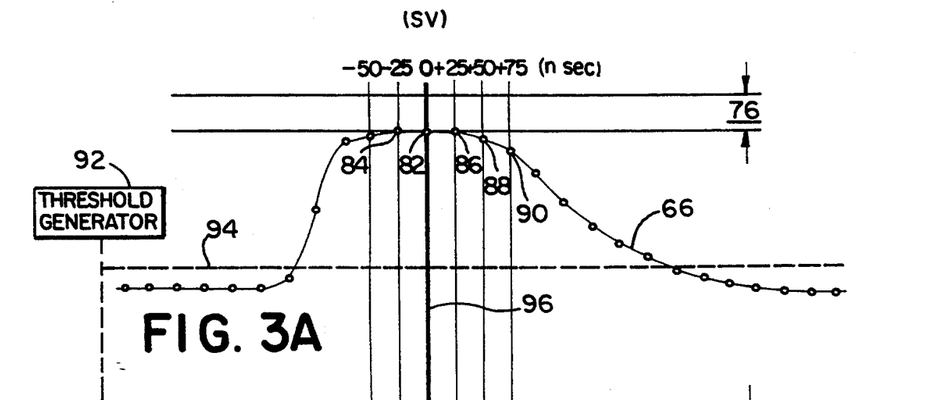
FIG. 3, composed of FIGS. 3(A), (B), and (C), illustrates the operation of the circuit arrangement for selecting predetermined samples of the amplitudes of the RF pulse envelope to determine time of arrival and pulse width.
Figure 3B:
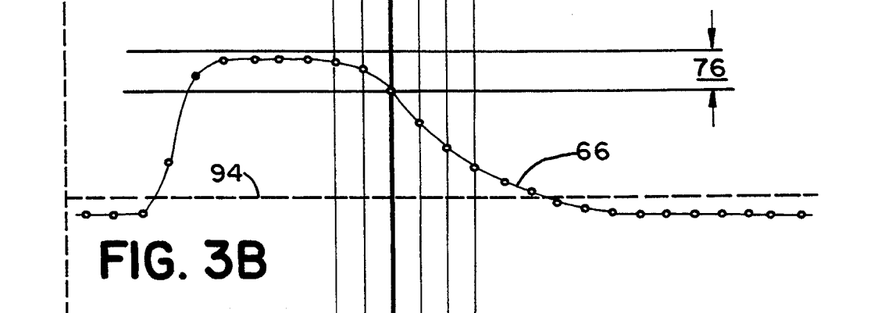
Figure 3C:
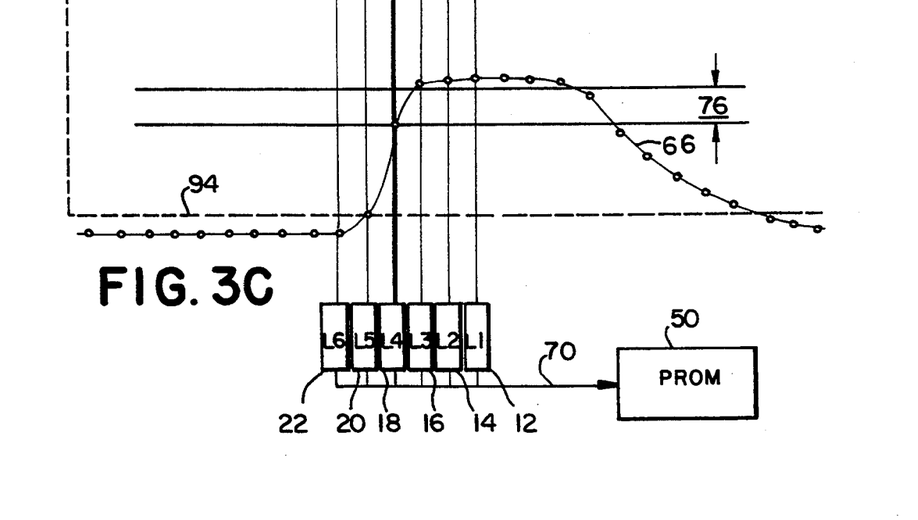

FIG. 3 is composed of FIGS. 3(A), (B) and (C); wherein FIG. 3(A) illustrates the points of interest related to the operation for measuring the maximum amplitude of the RF pulse envelope 66; FIG. 3(B) illustrates the points of interest related to the operation for measuring the trailing edge of the RF pulse envelope 66; and FIG. 3(C) illustrates the points of interest related to the operation for measuring the leading edge of the RF pulse envelope 66. The operation related to FIG. 3(A) is to be first described with the understanding that the description therefor is equally applicable to the operation of FIGS. 3(B) and (C) to be described hereinafter.

The points of interest for FIG. 3(A) are shown in its uppermost portion as circle symbols 82, 84, 86, 88, and 90 and which respectively represent the contents of the latches L4 (18), L5 (20), L3 (16), L2 (14), L1 (12), of FIG. 1. As seen in FIG. 3 (A), the point of interest 84 is earlier or precedent to the point of interest 82 by 25 nanoseconds, whereas the points of interest 86, 88, and 90 are later or subsequent to point of interest 82 by 25, 50 and 75 nanoseconds respectively. Still further, as seen in FIG. 3(A), the point of interest 82 is intersected by the lower boundary of the reference quantity 76. The points of interest 82 . . . 90 are in actuality data samples each being an eight (8) bit quantity and each representing a particular magnitude or amplitude of the RF pulse envelope 66. As seen in the bottommost portion of FIG. 3(A), the contents of the latches L1 (12), L2 (14), L3 (16), L4 (18), L5 (20), and L6 (22) are routed to the PROM 50 by way of data bus 70. Further, as seen in FIG. 3(A), a threshold generator 92 provides a quantity 94 (shown in phantom in FIGS. 3(A), (B), and (C)) which represent the minimum or threshold value of the data quantities, such as samples 82, 84, 86, 88, and 90, that is detected and used by the present invention. The threshold value or level 94 and the external threshold generator 92 are not considered part of the present invention and, therefore, are not to be further described herein.

In FIG. 3(A), the data samples, such as 84, related to the leading edge of the RF pulse envelope 66 are shown to the left, as is commonly seen for displays on an oscilloscope, whereas the earlier data samples, such as 90, are older than sample 84 and, therefore, these are shown to the right in a similar manner as used for an oscilloscope. As further seen in FIG. 3(A), data sample 82 (contents of the reference stage latch 18) is in coincidence with a reference line 96 which is also in coincidence with the control signal SV. The sample 82 (contents of latch 18 of FIG. 1) serves as a reference sample against which the other samples; e.g., 84, 86, 88, and 90 (contents of latches 20, 16, 14 and 12 of FIG. 1) respectively, are referenced.

The latches 12 . . . 28 of FIG. 1 provide nine (9) amplitude measurements, one in each of the latches shown therein, that are spaced apart by each other by a sample time of 25 nanoseconds. Accordingly, these nine (9) amplitude measurements are updated every 25 nanoseconds. As previously discussed, the occurrence of the control signal SV indicates that the sum of the contents of the reference latch 18 and the contents of reference quantity 76, represents that the contents (now sample 82) of latch 18 is within 6 dB of the maximum amplitude of the RF pulse envelope 66. In other words, the control signal SV would not have been generated unless sample 82 (coincident with SV) contains a value (an amplitude of the RF pulse envelope 66) which is equal to the maximum amplitude of the RF pulse envelope minus the 6 dB measuring point (reference quantity 76). Sample 82, as well as samples 84, 86, 88 and 90, are of particular importance to the present invention. Sample 84 is representative of amplitude or magnitude data of the RF pulse envelope 66 that occurred prior, by no more than 25 nanoseconds, to the 6 dB point of the RF pulse envelope 66 and the subsequent samples 86, 88 and 90 represent three (3) samples in which the amplitude or magnitude data, relative to that of data of 82, cannot exceed 6 dB. More particularly, since the time duration between any of the samples 84, 86, 88 and 90 is 75 nanoseconds or less, relative to the occurrence of sample 82, and, because the rise time $R_r$, previously discussed, of the RF pulse envelope 66 is greater than 6 dB within 75 nanoseconds, then this 6 dB criterion holds true. Furthermore, since the data samples 82, 84, 86, 88 and 90 have been quantized into 0.5 dB steps, then none of the samples 86, 88 and 90 cannot be separated from each other by more than 12 bits (6 dB/0.5 dB=12 bits).

The PROM 50 examines the amplitudes or magnitudes represented by samples 82, 84, 86, 88 and 90 to measure the RF pulse envelope 66. More particularly, the PROM 50 examines sample 84 as being representative of the magnitude of the RF pulse envelope 66 as it exists 25 nanoseconds prior to the 6 dB point (sample 82) of the RF pulse envelope 66 and, similarly, samples 86, 88 and 90 are examined as being representative of the magnitudes of the RF pulse envelope 66 as it exists up to 75 nanoseconds subsequent to the 6 dB point (sample 82) of the RF pulse envelope 66. The PROM 50 upon the detection of the control signal SV on signal path 80 examines the (prior) amplitude sample 84 and the next three (sequential) amplitude samples 86, 88 and 90. More particularly, the PROM 50 examines and gathers the magnitudes of the RF pulse envelope 66 represented by each of these four samples and compares such four magnitudes against predetermined waveform shapes (to be described) already stored in the PROM 50. These four magnitude data points, are four amplitude measurements that are focused on the rising edge of the RF pulse envelope 66. Mathematically, a third order polynominal will exactly pass through all four data points. This curve-fitting (polynominal) routine may be selected from the group comprising a third or higher order polynominal expressions some of which include natural exponents. These four data points are further processed by prestored and addressable routines. The routines are addressed by the twelve (12) bit address word provided by the networks 60, 62 and 64, previously discussed with reference to FIG. 2. One of the addressable routines is a programmed family of possible waveform shapes existing between the peak or maximum value of the RF pulse envelope 66 and its 6 dB measuring point. Another routine, or part of the same routine that includes the family of waveform shapes, has a polynominal expression arranged in a prescribed manner that reconstructs (curve fits) the sequence of the time measurements (samples 84, 86, 88 and 90) and compares this reconstruction against each of the family of waveform shapes to obtain a match therebetween. The successful match yields the time location of the RF pulse envelope 66 at its 3 dB (half-power) point. More particularly, the time location represents the time of arrival (TOA) of the RF pulse envelope 66. Furthermore, the obtainment of the exact 3 dB point, in turn, determines the exact pulse width (time difference between the 3 dB points on either side of the maximum amplitude). The exact time at the 3 dB location is based on an interpolation using the data (sample 82) present at the time of the occurrence of control signal SV and that of the known waveform shapes of the prestored and addressable routines of the PROM 50. The time of arrival (TOA) is provided as an eight (8) bit data word on signal path 98 shown in FIG. 2. The two most significant bits (MSB) of such a word identify which of the cycles (positive or negative) of the 25 nanosecond (40 MHz) clock, relative to the occurrence of the signal SV, is applicable to the measured time location, whereas the six least significant bits (LSB) of the data word provide a time resolution of 0.39 nanoseconds (25 nanoseconds/63). More particularly, the time of arrival (TOA) is definable within 0.39 nanoseconds because the time base; i.e., 25 nanoseconds is quantized (25/63) to 0.39 nanoseconds.

It should now be appreciated that the practice of the present invention provides a circuit arrangement 10, shown in FIGS. 1 and 2, that allows a relatively inexpensive. PROM 50 to provide precise time of arrival (TOA) and pulse width measurements of the RF pulse envelope 66 within an accuracy which is less than 1 nanosecond (0.39 nanoseconds). The circuit arrangement 10 instantaneously determines the time of arrival (TOA) of the RF pulse envelope 66 within less than 1 nanosecond by the examining only, by at least five (5), data points, 82, 84, 86, 88 and 90 shown in FIG. 3.

The present invention is equally applicable to measuring the time of arrival (TOA) of an RF pulse envelope 66 which is shorter than the allowable 75 nanoseconds (6db) window of the present invention. More particularly, the circuit arrangement 10 measures a RF pulse envelope 66 whose amplitude terminates in less than 75 nanoseconds subsequent to the occurrence of the control signal SV. When such a short pulse occurs, it typically causes one or two of the end measurements (86, 88 and 90) being examined by the PROM 50 to be lower in value than the first and/or second measurements (84 and 86). The PROM 50 detects this condition by sensing a four (4) bit address (part of the composite twelve (12) bit address composed by the networks 60, 62 and 64) value equal to fifteen (15) which is substituted and made up by the network 60, 62 or 64. These networks 60, 62 and 64 make up this fifteen (15) bit (binary) quantity by detecting the eight (8) bit binary quantities being received from the adjacent latches 52, 54, 56 and 58. The routines of the PROM 50 merely substitutes a zero difference between sequential measurements (84, 86, 88 and 90), thereby, treating a short RF pulse envelope 66 as just the beginning of a longer or normal RF pulse envelope 66.

With reference to FIGS. 3(B) and 3(C), separate time of arrival and pulse width measurements (each having a circuit arrangement 10 shown in FIGS. 1 and 2) may be employed on the trailing and leading edges of the RF pulse envelope 66. The description of the operation of the circuit arrangement of FIGS. 1 and 2, previously given with reference to FIG. 3(A), is applicable to FIGS. 3(B) and (C). The essential difference with regard to the operation related to FIGS. 3(B) and (C) is that the reference quantity 76 of FIG. 3(A) was preferably selected to be 6 dB, whereas the reference quantity 76 of FIGS. 3(B) and (C) is preferably selected to be 3 dB. The operation of the circuit arrangement of FIGS. 1 and 2 provides a quantity on signal path 98 defining a time of arrival and accurate pulse width measurement related to the trailing edge of FIG. 3(B) or to the leading edge of FIG. 3(C) that is accurate to less than 1 nanosecond (0.39 nanoseconds).

For all of the embodiments of the present invention, because the bandwidth of the receiver accepting RF pulse envelope 66 is less than 15 MHz, the 40 MHz (25 nanosecond clock 68) sampling rate is well beyond the Nyquist rate so that stability for the circuit arrangement of FIGS. 1 and 2 is assured. Sampling rates at higher frequencies (greater than 40 MHz) do not produce further improvements in the accuracy of the measurements of time of arrival (TOA) and pulse width of the RF pulse-envelope 66.

Figure 4A:
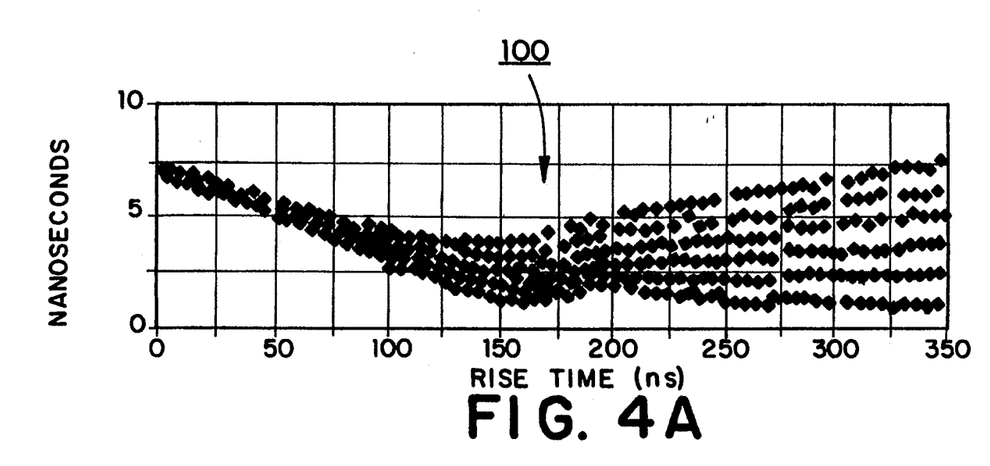
Figure 4B:
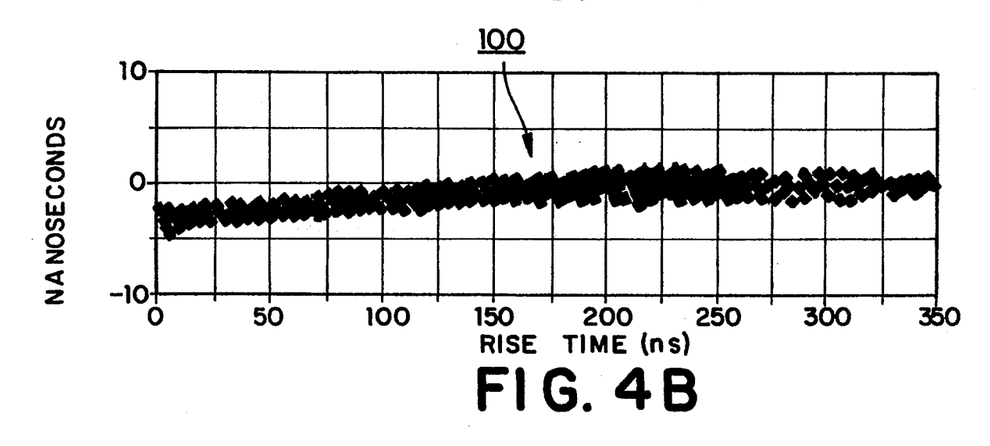

In the practice of the present invention a Monte Carlo technique was used to provide a mathematical model thereof and the results of such modeling may be further described with reference to FIG. 4. FIG. 4 is composed of FIGS. 4(A) and (B), which respectively illustrate the standard deviation and the mean error distributions both provided by the Monte Carlo statistical analysis. FIGS. 4(A) and (B) have a Y axis given in nanoseconds and an X axis representative of the rise time, given in nanoseconds, of the RF pulse envelope 66. Both FIGS. 4(A) and (B) illustrate a plurality of random time of arrival times (TOA's) of RF pulse envelope 66 serving as statistical test data and shown as dots 100. As seen in FIG. 4(A), the test data 100 does not have a standard deviation that substantially exceeded 7.5 nanoseconds, even when the rise time of the RF pulse envelope 66 is about 350 nanoseconds which is much higher than the previously discussed rise time ($R_r$) of 75 nanoseconds. Similarly, as seen in FIG. 4(B), the test data 100 does not exceed a mean error of $-5$ nanoseconds, even when the rise time of the RF pulse envelope 66 is about 350 nanoseconds. Accordingly, the Monte Carlo statistical analysis shown in FIGS. 4(A) and (B) illustrate that the circuit arrangement of FIGS. 1 and 2 provides for accurate measurements of the time of arrival (TOA) and pulse width of the RF pulse envelope 66.

It should now be appreciated that the practice of the present invention provides for the circuit arrangement 10 of FIGS. 1 and 2 to accurately measure the time of arrival (TOA) and pulse width of RF pulse envelope 66, as well as to accurately measure the leading and trailing edges of the RF pulse envelope 66.

In addition to providing a circuit arrangement for accurately measuring the time of arrival and pulse width of the RF envelope, the present invention teaches the principles of measuring signal levels having various rise and fall times and accurately measuring parameters thereof.

I claim:

1. A circuit arrangement for receiving, holding and measuring an RF pulse envelope having an amplitude with predetermined rise and fall times and comprising digital words having a predetermined number of bits with a predetermined bit resolution, said circuit arrangement comprising:

(a) a first plurality of sequential latches responsive to a timing signal having a predetermined frequency and each latch receiving and storing one of said digital words, said first plurality of latches each having an output and arranged into lower and upper stages with one of the said lower stages serving as a reference stage;

(b) a summing reference network having an output and first and second inputs with the first input being connected to said output of said reference stage and the second input being connected to a reference quantity comprising a digital word and defining a predetermined reference point of the RF pulse envelope;

(c) a first plurality of subtracting networks each having an output and first and second inputs, said plurality of subtracting networks being arranged so that one of each has its first input respectively connected to the output of said lower and upper stages, except for said reference stage, of said first plurality of latches, each of said first plurality of substituting networks having its second input connected to said output of said summing reference network;

(d) a logic element having inputs connected to each of said outputs of said first plurality of subtracting networks anti generating an output control signal SV in the absence of all signals on its inputs, the occurrence of said output control signal SV being indicative that the sum of both the contents of said reference stage and the contents of said reference quantity is within said predetermined point of the maximum amplitude of the RF pulse envelope;

(e) a second plurality of sequential latches each having input and output stages, an output and first and second inputs and all being responsive to said control signal SV and said timing signal, said second plurality of latches being arranged in parallel with and receiving and storing the digital words received and stored by said upper stages of said first plurality of latches;

(f) a second plurality of subtracting networks each having an output and first and second inputs, a first network of which has its input connected to the output of the first latch of said second plurality of latches and its second input connected to the output of the second latch of said second plurality of latches, a second network of which has its first input connected to the second input of the first network and its second input connected to the output of the third latch of said second plurality of latches, and a third network of which has its first input connected to the second input of said second network and its second input connected to the output of the fourth latch of said second plurality of latches; and (g) a PROM having prestored and addressable routines and receiving the outputs of said second plurality of subtracting networks, the outputs of said first sequential latches and the output signal SV, said output of the reference stage containing first data which is in coincidence with said control signal SV and which defines the amplitude of the RF pulse envelope at said predetermined point, said output of said lower latches of said first plurality of latches containing second data that defines the preceding and subsequent amplitudes of the RF pulse envelope relative to said predetermined point, said output of said second plurality of subtracting networks defining an address to access a family of waveform shapes having a peak value defined by said predetermined point, said PROM further having routines so that said preceding and subsequent amplitudes of the RF pulse envelope are compared against each of the family of waveform shapes to define a match that provides the time location, relative to the occurrence of said control signal SV, of the 3 dB point on the RF pulse envelope, said time location corresponding to a time of arrival (TOA) parameter of said RF pulse envelope and also defining the pulse width of said RF pulse envelope, said time location being definable within selectable increments of said predetermined frequency of said timing signal.

2. The circuit arrangement according to claim 1, wherein said RF pulse envelope has a rise time which exceeds 6 dB in a 75 nanosecond duration and a fall time which exceeds 6 dB within a duration of 125 nanoseconds.

3. The circuit arrangement according to claim 1, wherein each of said digital words comprising said RF pulse envelope has eight (8) bits with each bit having a resolution of 0.5 dB.

4. The circuit arrangement according to claim 1, wherein said timing signal has a repetition rate of 25 nanoseconds.

5. The circuit arrangement according to claim 1, wherein said first and second plurality of latches contain eight (8) bits of information each representative of a particular magnitude of the amplitude of said RF pulse envelope.

6. The circuit arrangement according to claim 1, wherein the first plurality of sequential latches are arranged so that their lower stages comprises first, second, third and fifth sequential latches, said reference stage comprises a fourth sequential latch, and said upper stage comprises sixth, seventh, eighth and ninth sequential latches.

7. The circuit arrangement according to claim 5, wherein said summing reference network receives an eight (8) bit quantity on both its first and second inputs and said reference quantity is also an eight (8) bit quantity having a bit weight of 0.5 dB and representing one of the −3 dB and −6 dB reference points of said RF pulse envelope.

8. The circuit arrangement according to claim 5, wherein each of said first plurality of subtracting networks receives an eight (8) bit quantity on both its first and second inputs and provides a one (1) bit quantity on its output when said first input exceeds said second input.

9. The circuit arrangement according to claim 5, wherein each of said first and second inputs of each of said second plurality of subtracting networks receives an eight (8) bit quantity and supplies a four (4) bit quantity representative of the difference of the quantities of its first and second inputs, said second plurality of subtracting networks having each of its third, second and first networks supplying a four (4) bit quantity that is arranged into a composite twelve (12) bit address that is used for addressing said addressable routines of said PROM.

10. The circuit arrangement according to claim 1, wherein said second data defining said precedent amplitude data comprise a first sample of amplitude occurring 25 nanoseconds before said occurrence of said control signal SV and said subsequent amplitude data comprises second, third and fourth samples of amplitude data occurring within 75 nanoseconds after said occurrence of said control signal SV.

11. The circuit arrangement according to claim 10, wherein said first, second, third and fourth samples each represents a particular magnitude and are curve fitted by a routine selected from the group comprising a third or higher order polynominal expressions some of which include natural exponents and all of which provide a curve which passes through all of said data represented by said first, second, third and fourth samples.

12. The circuit arrangement according to claim 7, wherein said time location is defined by an eight (8) bit word and each of said increments corresponds to 0.39 nanoseconds.

13. The circuit arrangement according to claim 1, wherein said reference quantity corresponds to a 6 dB reference point.

14. The circuit arrangement according to claim 1, wherein said reference quantity corresponds to a 3 dB reference point.

15. A method for measuring an RF pulse envelope having an amplitude with definable rise and fall times and comprising digital words having a predetermined number of bits with a predetermined bit resolution, said method comprising the steps of:

(a) providing a first plurality of sequential latches responsive to a timing signal having a predetermined frequency and each latch receiving and storing one of said digital words, said first plurality of latches each having an input and output and arranged into lower and upper stages with one of said lower stages serving as a reference stage;

(b) providing a summing reference network having an output and first and second inputs with the first input connected to said output of said reference stage;

(c) providing a reference quantity comprising a digital word which defines a predetermined point of said RF pulse envelope;

(d) selecting said predetermined point to correspond to the −6 dB point of said RF pulse envelope and connecting said reference quantity to said second input of said summing reference network;

(e) providing a first plurality of subtracting networks each having an output and first and second inputs, said plurality of subtracting networks being arranged so that each one has its first input respectively connected to the output of said lower and upper stages, except for said reference stage, of said first plurality of latches, each of said first plurality of subtracting networks having its second input connected to said output of said summing reference network;

(f) a logic element having inputs connected to each of said outputs of said first plurality of subtracting networks and generating an output control signal SV in the absence of any signal on its inputs, the occurrence of said output control signal SV being indicative that the sum of both the contents of said reference stage and the contents of said reference quantity is within the −6 dB point of the maximum amplitude of the RF pulse envelope;

(g) providing a second plurality of sequential latches each having input and output stages, an output and first and second inputs and all being responsive to said control signal SV and to said timing signal, said second plurality of latches being arranged in parallel with and receiving and storing the digital words received and stored by said upper stages of said first plurality of latches;

(h) providing a second plurality of subtracting networks each having an output and first and second inputs, a first network which has its first input connected to the output of the first latch of said second plurality of latches and its second input connected to the output of the second latch of said second plurality of latches, a second network which has its first input connected to the second output of said first network and a second input connected to the output of the third latch of said second plurality of latches, and a third network which has its first input connected to the second input of said second network and its second input connected to the output of the fourth latch of said second plurality of latches; and (i) providing a PROM having prestored and addressable routines and receiving the outputs of said second plurality of subtracting networks, the outputs of said first sequential latches and the output signal SV, said output of the reference stage containing first data which is in coincidence with said control signal SV and which defines the amplitude of the RF pulse at said predetermined −6 dB point, said output of said lower latches of said first plurality of latches comprising second data that defines the precedent and subsequent amplitudes of the RF pulse envelope relative to said predetermined −6 dB point, said output of said plurality of networks defining an address to access a family of waveform shapes having a peak value as defined by said −6 dB predetermined point, said PROM having further routines so that said precedent and subsequent amplitudes of the RF pulse envelope are compared against each of the family of waveform shapes to define a match therebetween that provides the time location, relative to the occurrence of said control signal SV, of the −3 dB point on the RF pulse envelope, said time location corresponding to a time of arrival (TOA) parameter of said RF pulse envelope and also defining the pulse width of said RF pulse envelope, said time location being definable within selectable increments of said predetermined frequency of said timing signal.

16. The method according to claim 15, wherein said RF pulse envelope has a rise time which exceeds 6 db in a 75 nanosecond duration and a fall time which exceeds 6 db within a duration of 125 nanoseconds.

17. The method according to claim 15, wherein each of said digital words comprising said RF pulse envelope includes eight (8) bits with each bit having a resolution of 0.5 dB.

18. The method according to claim 15, wherein said timing signal has a repetition rate of 25 nanoseconds.

19. The method according to claim 15, wherein said first and second plurality of latches contain eight (8) bits of information representative of a respective digital word comprising said RF pulse envelope.

20. The method according to claim 15, wherein the first plurality of sequential latches are arranged so that their lower stages comprises first, second, third and fifth sequential latches, said reference stage comprises a fourth sequential latch, and said upper stage comprises sixth, seventh, eighth and ninth sequential latches.

21. The method according to claim 15, wherein said summing reference network receives an eight (8) bit quantity on both its first and second inputs and said reference quantity is also an eight (8) bit word having a bit weight of 0.5 dB and representing one of the −3 dB and −6 dB reference points of said RF pulse envelope.

22. The method according to claim 19, wherein each of said first and second inputs of each of said second plurality of subtracting networks receives an eight (8) bit quantity and supplies a four (4) bit quantity representative of the difference of the quantities of its first and second inputs, said second plurality of subtracting networks having each of its third, second and first networks supplying a four (4) bit quantity that is arranged into a composite twelve (12) bit address that is used for addressing said addressable routines of said PROM.

23. The method according to claim 15, wherein said second data defining said precedent amplitude comprises a first sample of amplitude data occurring 25 nanoseconds before said occurrence of said control signal SV and said subsequent amplitude data comprises second, third and fourth samples of amplitude data occurring within 75 nanoseconds after said occurrence of said control signal SV.

24. The method according to claim 23, wherein said first, second, third and fourth samples each represent a magnitude and are curve fitted by a routine selected from the group comprising a third or higher polynominal expressions some of which include natural exponents and all of which provide a curve which passes through all of said data represented by said first, second, third and fourth samples.

25. The method according to claim 15, wherein said time location is defined by an eight (8) bit word and each of said increments corresponds to 0.39 nanoseconds.

* * * * *

UNITED STATES PATENT AND TRADEMARK OFFICE
CERTIFICATE OF CORRECTION

PATENT NO. : 5,365,238
DATED : November 15, 1994
INVENTOR(S) : William B. Sullivan It is certified that error appears in the above-indentified patent and that said Letters Patent is hereby corrected as shown below:

Column 12, line 64, "anti" should be "and".

Signed and Sealed this

Thirty-first Day of January, 1995

Attest:

BRUCE LEHMAN

Attesting Officer

Commissioner of Patents and Trademarks